(12) United States Patent
Kamio

(10) Patent No.: US 10,813,260 B2
(45) Date of Patent: Oct. 20, 2020

(54) COMPONENT MOUNTING DEVICE

(71) Applicant: FUJI CORPORATION, Chiryu-shi (JP)

(72) Inventor: Ryohei Kamio, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 310 days.

(21) Appl. No.: 15/025,052

(22) PCT Filed: Sep. 25, 2013

(86) PCT No.: PCT/JP2013/075907
§ 371 (c)(1),
(2) Date: Mar. 25, 2016

(87) PCT Pub. No.: WO2015/045033
PCT Pub. Date: Apr. 2, 2015

(65) Prior Publication Data
US 2016/0249500 A1 Aug. 25, 2016

(51) Int. Cl.
*H05K 13/08* (2006.01)
*H05K 13/04* (2006.01)

(52) U.S. Cl.
CPC ......... *H05K 13/08* (2013.01); *H05K 13/0404* (2013.01); *H05K 13/087* (2018.08)

(58) Field of Classification Search
CPC .. H05K 13/08; H05K 13/0404; H05K 13/046; H05K 13/04; H05K 13/087;
(Continued)

(56) References Cited

U.S. PATENT DOCUMENTS 5,255,429 A    10/1993  Nishi et al.
5,379,514 A *   1/1995  Okuda ............... H05K 13/0882
                                                         29/833
(Continued)

FOREIGN PATENT DOCUMENTS

JP    2003-92495 A    3/2003
JP    2004-221518 A   8/2004
(Continued)

OTHER PUBLICATIONS

Office Action dated Jun. 12, 2017 in Japanese Patent Application No. 2015-538682 (with unedited computer generated English translation).
(Continued)

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

A component mounting device stores a correspondence relationship between identification codes and head types in an HDD. A CPU of the component mounting device reads a two-dimensional bar-code of a head which is stored in a head storage area using a bar-code reader when exchanging a first head which is held in a head holding body of a head unit for a second head which is stored in the head storage area. The CPU looks up the identification code included in the two-dimensional bar-code in the correspondence relationship which is stored in the HDD and recognizes the head type which is stored in the head storage area. Subsequently, the CPU controls the head holding body of the head unit to perform head exchanging operations according to the recognized head type.

5 Claims, 8 Drawing Sheets

(58) Field of Classification Search
CPC ......... Y10T 29/53174; Y10T 29/53178; Y10T 29/53183; Y10T 29/53191; Y10T 29/53039
USPC .......... 29/832, 701, 714, 729, 739, 740, 741
See application file for complete search history.

(56) References Cited

U.S. PATENT DOCUMENTS

| | | | | |
|---|---|---|---|---|
| 6,002,650 | A * | 12/1999 | Kuribayashi | G05B 19/4097 700/117 |
| 6,334,115 | B1 * | 12/2001 | Kuribayashi | H05K 13/085 705/27.2 |
| 6,519,838 | B1 * | 2/2003 | Okuda | H05K 13/0409 29/740 |
| 6,868,603 | B2 * | 3/2005 | Okuda | H05K 13/0409 29/832 |
| 7,127,459 | B2 * | 10/2006 | Kuribayashi | G06F 30/00 |
| 7,488,283 | B2 * | 2/2009 | Yasui | H05K 13/0409 483/1 |
| 7,966,718 | B2 * | 6/2011 | Kodama | H05K 3/305 29/739 |
| 8,019,455 | B2 * | 9/2011 | Maenishi | H05K 13/085 700/99 |
| 8,881,385 | B2 * | 11/2014 | Endo | H05K 13/0452 29/840 |
| 2002/0073536 | A1 * | 6/2002 | Okuda | H05K 13/041 29/740 |
| 2004/0080897 | A1 * | 4/2004 | Kodama | H05K 13/0882 361/234 |
| 2006/0085973 | A1 | 4/2006 | Kodama et al. | |
| 2006/0111222 | A1 * | 5/2006 | Yasui | H05K 13/0409 483/1 |
| 2006/0207090 | A1 | 9/2006 | Kawada | |
| 2010/0229380 | A1 * | 9/2010 | Endo | H05K 13/0409 29/760 |
| 2010/0257728 | A1 * | 10/2010 | Hiraki | H01L 24/743 29/739 |
| 2011/0225811 | A1 | 9/2011 | Kodama et al. | |

FOREIGN PATENT DOCUMENTS

| | | |
|---|---|---|
| JP | 2006-261325 A | 9/2006 |
| JP | 4546857 B2 | 9/2010 |

OTHER PUBLICATIONS

International Search Report dated Dec. 3, 2013 for PCT/JP2013/075907 dated Sep. 25, 2013.
Extended Search Report dated Sep. 12, 2016 in European Patent Application No. 13894524.1.

* cited by examiner

COMPONENT MOUNTING DEVICE

TECHNICAL FIELD

The present disclosure relates to a component mounting device.

BACKGROUND ART

In the related art, there is known a component mounting device in which a component is sucked at a tip of a nozzle which is provided on a head and the sucked component is mounted at a predetermined position on a printed circuit board. As such a component mounting device, there is known a component mounting device which exchanges a single nozzle head which is provided with a single nozzle which is held in a head holding section for a revolver head which is provided with twelve nozzles (PTL 1). Specifically, the head holding section holding the single nozzle head moves to a vacant single nozzle head storage section, releases the held single nozzle head, and after freeing the head holding section, the head holding section is moved to a revolver head storage section in which a revolver head is stored and holds the revolver head.

CITATION LIST

Patent Literature

PTL 1: JP-A-2006-261325

SUMMARY

However, with the component mounting device described above, although which position of stored head to be used in exchange is recognized before the head exchanging, in a case in which an operator has not set the correct head in that position, there is a concern that the head cannot be held properly, or, even if it is possible to perform the exchange, inappropriate control for the head will be executed after the exchange.

The present disclosure was made in order to solve such problems, and the main object is to execute an exchanging operation appropriate for the type of exchange target head in a component mounting device.

A component mounting device of the present disclosure that holds a component on a tip of a nozzle which is provided on a head and mounts the held component at a predetermined position on a printed circuit board, the component mounting device including memory means for storing a correspondence relationship between identification codes and head types, storage means for storing one or more heads to which the identification codes are added, head holding means for holding the head, head movement means for moving the head holding means, reading means for reading the identification code which is added to the head which is stored in the storage means, and control means for looking up the identification code which is read by the reading means in the correspondence relationship before head exchanging, recognizing a head type of the head which is stored in the storage means, and controlling one or both of the head holding means and the head movement means to perform head exchanging operations according to the recognized head type when exchanging the head being held in the head holding means for the head which is stored in the storage means.

In the component mounting device, the control means recognizes the head type of the head which is stored in the storage means by looking up the identification code which is read by the reading means before the head exchanging in the correspondence relationship between the identification code and the head type when exchanging the head which is held in the head holding means for the head which is stored in the storage means. Subsequently, the control means controls one or both of the head holding means and the head movement means to perform the head exchanging operations according to the recognized head type. In this manner, since the head type is recognized from the identification code which is added to the head before the head exchanging, the component mounting device can correctly recognize the head type which is stored in the storage means. Since the component mounting device performs the head exchanging operations according to the head type which is correctly recognized, it is possible to execute exchanging operations which are appropriate for the head type.

Note that, the "head exchanging operations" are different operations from the ordinary component mounting operations, and refer to operations which are necessary for exchanging the head. The "head exchanging operations" include one or both of the operations necessary for the head exchanging which are performed after the head holding means holds the exchange target head, and the operations necessary for the head exchanging which are performed up to a point at which the head holding means holds the exchange target head.

In the component mounting device of the present disclosure, the control means may control one or both of the head holding means and the head movement means to perform, from the head exchanging operations, at least operations after the head holding means holds an exchange target head according to the recognized head type. By doing so, it is possible to appropriately execute the operations after the head holding means holds the exchange target head according to the head type.

In the component mounting device of the present disclosure, the head holding means may include one or more of a nozzle lifting/lowering mechanism that lifts/lowers the nozzle which is provided in the head, a head lifting and lowering mechanism which lifts/lowers the head, an opening/closing mechanism that opens/closes a valve which adjusts a pressure of the nozzle, and a camera lifting/lowering mechanism that lifts/lowers the camera which images the component which is held on a tip of the nozzle from a horizontal direction, and the control means may control at least one of mechanisms included in the head holding means to perform, from the head exchanging operations, at least operations after the head holding means holds the exchange target head, according to the recognized head type. By doing so, even in a case in which the height of the nozzle, the height of the head, the position of the pressure adjustment valve of the nozzle, the position of the component which is held on the nozzle tip, and the like differ depending on the head type, it is possible to appropriately handle the differences.

In the component mounting device of the present disclosure, the control means may control one or both of the head holding means and the head movement means to perform, from the head exchanging operations, at least operations up to a point at which the head holding means holds the exchange target head according to the recognized head type. By doing so, it is possible to appropriately execute the operations up to a point at which the head holding means holds the exchange target head according to the head type of the head exchanging operations.

In the component mounting device of the present disclosure, the head holding means may include an engagement member which engages with an engaged member which is provided on the head, the head may be provided with the engaged member at a different height according to the head type, and the control means may control the head holding means to perform, from the head exchanging operations, at least operations up to a point at which the engagement member of the head holding means holds the engaged member of the exchange target head, according to a height of the recognized head type. By doing so, even in a case in which, for example, the height of the engaged member of the head differs according to the head type, it is possible to cause the engagement member of the head holding means to appropriately engage with the engaged member of the head.

DETAILED DESCRIPTION

Figure 1:
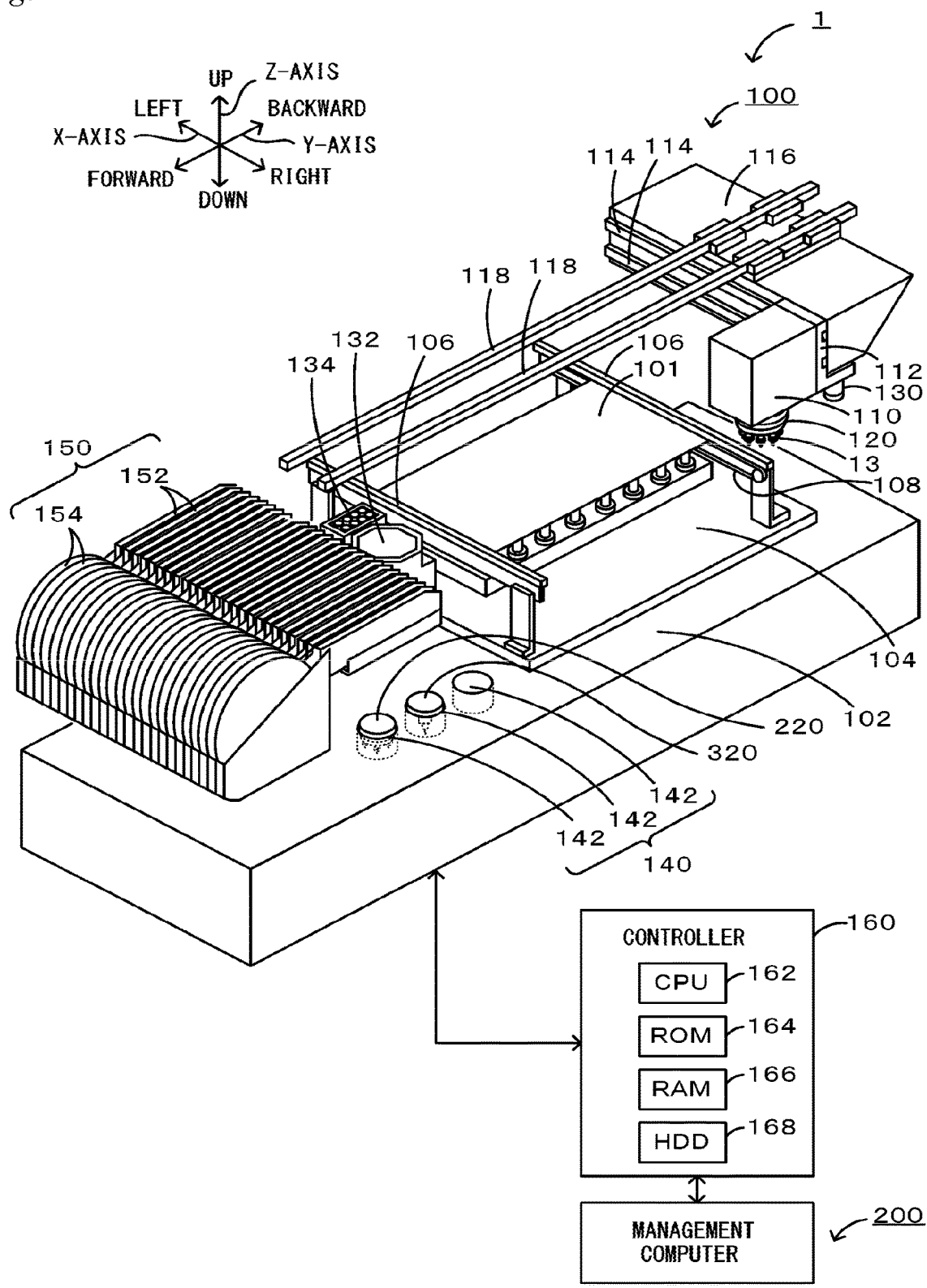
FIG. 1 is an explanatory diagram illustrating the overall configuration of a component mounting system 1.

Hereinafter, description will be given of a favorable embodiment of the present disclosure with reference to the drawings. FIG. 1 is an explanatory diagram illustrating the overall configuration of a component mounting system 1. Note that, in the present embodiment, the left-right directions (an X axis), the forward-backward directions (a Y axis), and the up-down directions (a Z axis) are as illustrated in FIG. 1.

[Configuration of Component Mounting System 1]

The component mounting system 1 is provided with a component mounting device 100 and a management computer 200.

As illustrated in FIG. 1, the component mounting device 100 is provided with a board conveyance device 104 which is mounted on a base 102, a head unit 110 which is capable of moving in an XY plane, a first head 120 which is attached to the head unit 110 in a detachable manner, a mark camera 130 which images a printed circuit board 101 from above, a parts camera 132 which images a component which is sucked by a suction nozzle 13 from below, a head storage area 140 for storing various heads, a component supply device 150 which supplies the components to be mounted to the printed circuit board 101, and a controller 160 which executes various control.

The board conveyance device 104 conveys the printed circuit board 101 from left to right using conveyor belts 108 and 108 (only one shown in FIG. 1), each of which is attached to one of the pair of supporting boards 106 and 106 of the front and rear.

The head unit 110 is attached to an X-axis slider 112, moves in the left-right directions together with the movement of the X-axis slider 112 in the left-right directions along guide rails 114 and 114, and moves in the forward-backward directions together with the movement of a Y-axis slider 116 in the forward-backward directions along guide rails 118 and 118. Therefore, the head unit 110 is capable of moving in an XY plane. Each of the sliders 112 and 116 is driven by respective servomotors which are not depicted in the drawings.

The first head 120 is attached to the head unit 110 in a detachable manner. Using pressure, the suction nozzle 13 sucks a component to the nozzle tip, releases the component which is sucked by the nozzle tip, and the like. Although twelve of the suction nozzles 13 are attached to the first head 120, there are four attached to the second head 220, and one attached to the third head 320.

The mark camera 130 is attached to the bottom surface of the X-axis slider 112. There is an imaging region below the mark camera 130, which is a camera which reads marks added to the printed circuit board 101. The marks indicate the fiducial position on the printed circuit board 101. The fiducial position is used when mounting the component which is sucked by the suction nozzle 13 on a predetermined position on the printed circuit board 101. The mark camera 130 includes a function of a bar-code reader which reads two-dimensional bar-codes added to various heads.

The parts camera 132 is arranged on the front side of the board conveyance device 104. When the suction nozzle 13 which sucks the component passes over the parts camera 132, the parts camera 132 images the state of the component which is sucked by the suction nozzle 13. The image which is captured by the parts camera 132 is used to determine whether the component is correctly sucked by the suction nozzle 13.

The head storage area 140 is provided on the right side of the top face of the base 102, and includes a plurality of storage locations 142 for storing the first to third heads 120, 220, and 320. The second head 220 and the third head 320 are stored in each of the front two storage locations 142, and the rearmost storage location 142 is in a vacant state.

The component supply device 150 is attached to the front of the component mounting device 100. The component supply device 150 includes a plurality of slots, and it is possible to insert a feeder 152 into each slot. A reel 154 in which a tape is wound is attached to the feeder 152. The components are held on the surface of the tape in a state of being lined up along the longitudinal direction. The components are protected by a film which covers the surface of the tape. The tape is fed out to the rear by a sprocket mechanism which is not depicted in the drawings, the film is peeled off, and a component is arranged in a predetermined position in an exposed state. The predetermined position is a position in which the suction nozzle 13 is capable of sucking the component. The suction nozzle 13 which sucks the component in the predetermined position can mount the component in a specified position on the printed circuit board 101.

In addition, the component mounting device 100 is provided with a nozzle stocker 134 and the like. The nozzle stocker 134 is a box which stocks plural types of the suction nozzle 13, and is arranged adjacent to the parts camera 132. The suction nozzle 13 is exchanged for one that is appropriate for the type of printed circuit board onto which to mount the component or the type of the component.

The controller 160 is provided with a CPU 162 which executes various control, a ROM 164 which stores control programs and the like, a RAM 166 which is used as a working area, and an HDD 168 which stores large volume data, and these are connected by a bus which is not depicted in the drawings. The controller 160 is connected such that it is possible to perform transactions of signals with the board conveyance device 104, the X-axis slider 112, the Y-axis slider 116, and the head unit 110.

The management computer 200 is a computer which manages a production job of the printed circuit board 101, and stores the production job data which is created by an operator. The production job data specifies which board type of the printed circuit board 101 to mount which components in which order from the feeder of which slot position in the component mounting device 100, how many printed circuit boards 101 mounted in this manner to manufacture, and the like. The management computer 200 is connected to be capable of bidirectional communication with the controller 160 of the component mounting device 100.

Figure 2:
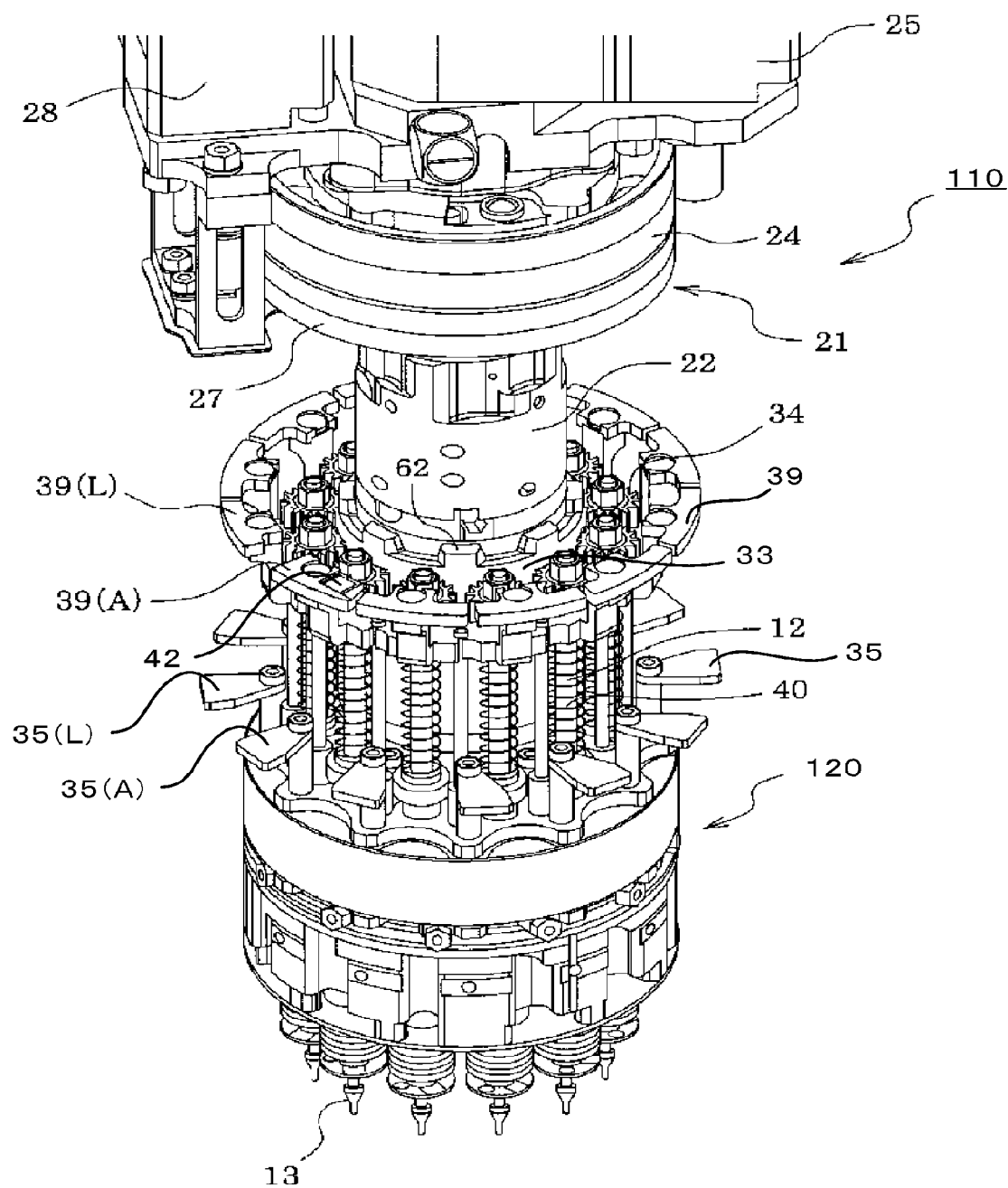
FIG. 2 is a perspective diagram of a head unit 110.
Figure 3:
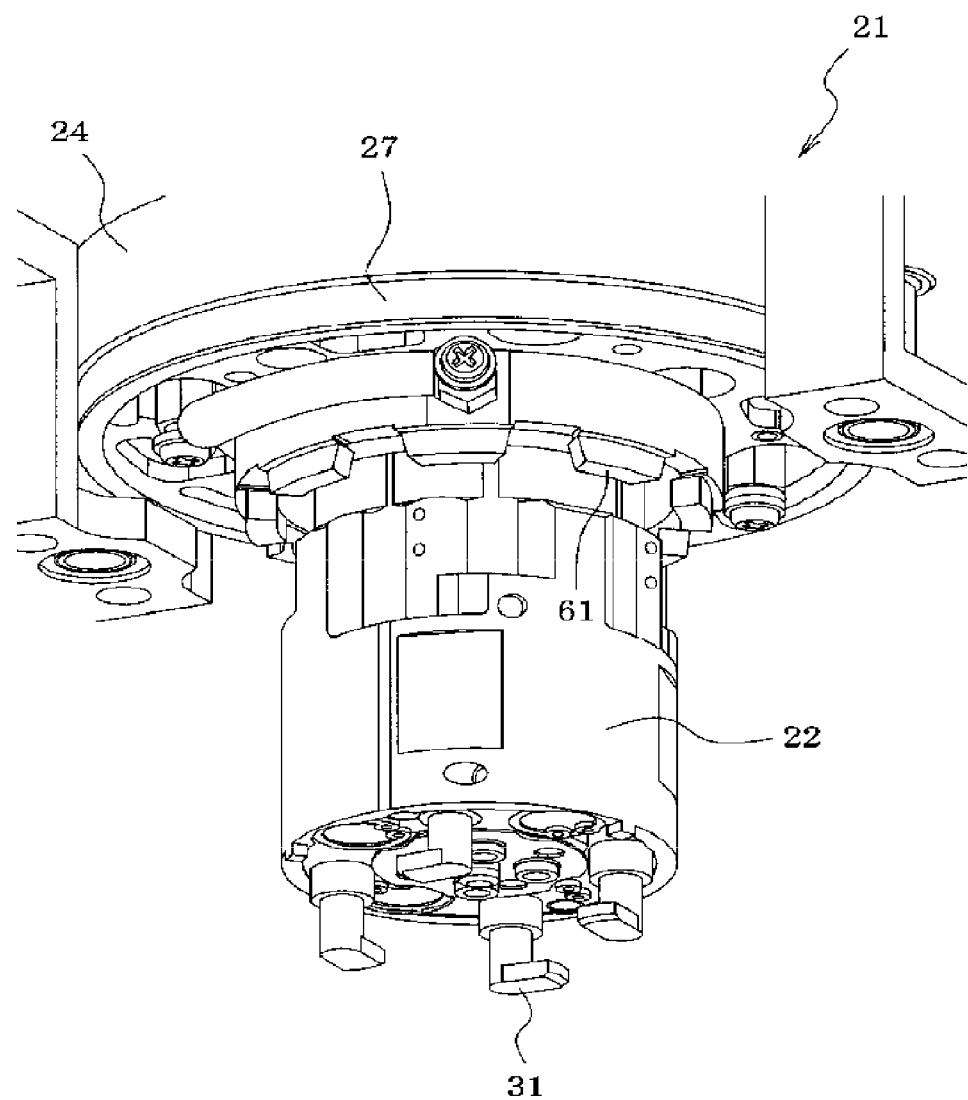
FIG. 3 is a perspective diagram of a head holding body 21 as viewed obliquely upward from below.
Figure 4:
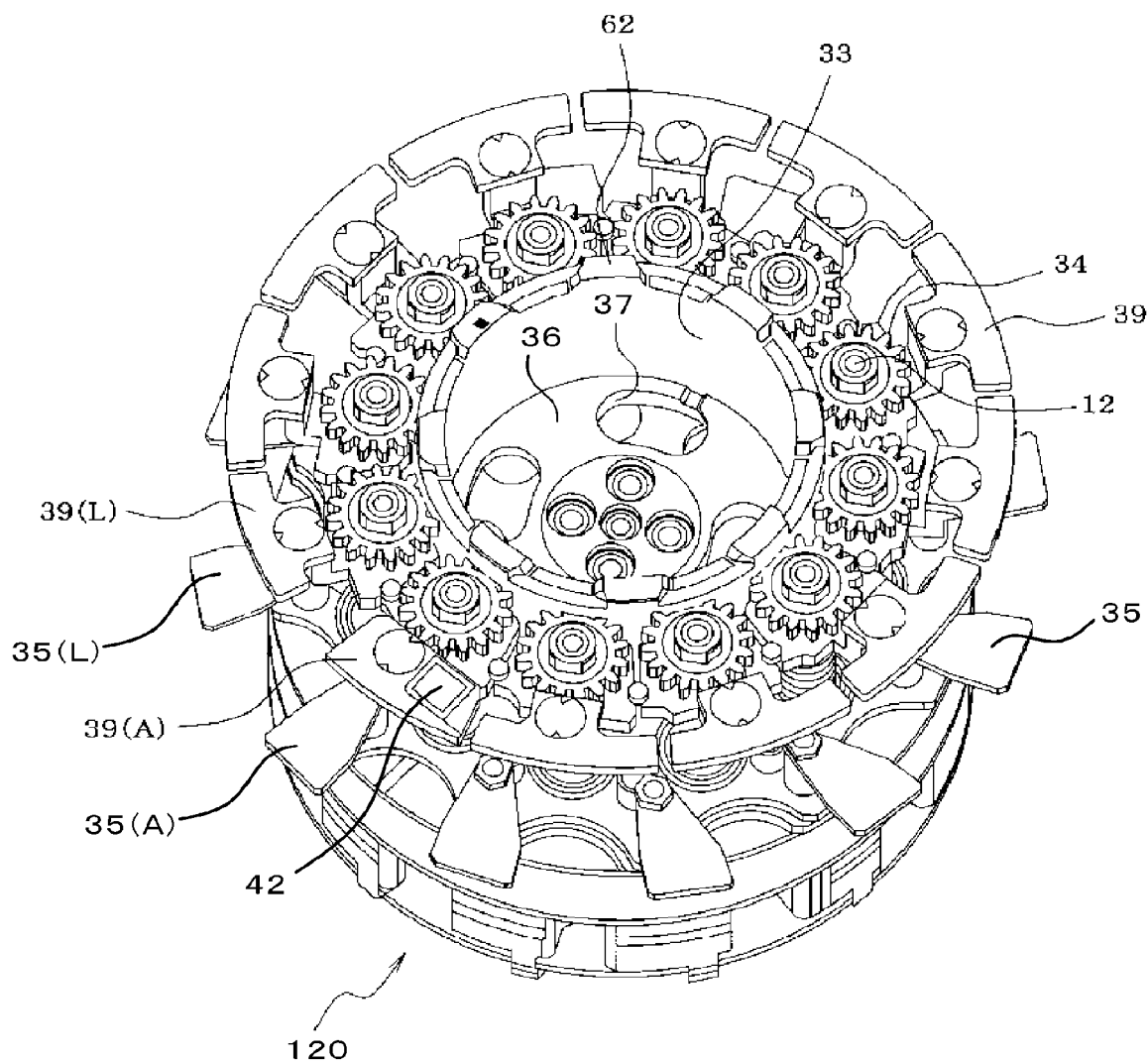
FIG. 4 is a perspective diagram of a first head 120 as viewed obliquely downward from above.

Here, detailed description will be given of the head unit 110. FIG. 2 is a perspective diagram of the head unit 110 in a state in which the cover is removed, more specifically, a perspective diagram of a state in which the first head 120 is lowered in relation to an R shaft 22 of the head holding body 21. FIG. 3 is a perspective diagram of the head holding body 21 as viewed obliquely upward from below, and FIG. 4 is a perspective diagram of the first head 120 as viewed obliquely downward from above.

The head unit 110 is provided with the head holding body 21 and the first head 120.

The head holding body 21 is attached to the X-axis slider 112 (refer to FIG. 1) to be possible to lift/lower using the lifting/lowering mechanism which is not depicted in the drawings. The head holding body 21 includes two ring-shaped gears, an R shaft gear 24 and a Q shaft gear 27 on the top portion, and the columnar R shaft 22 on the bottom portion. The R shaft gear 24 and the Q shaft gear 27 are attached to rotate independently of each other. The R shaft gear 24 is rotationally driven by an R shaft motor 25, and rotates integrally with the R shaft 22. The Q shaft gear 27 is rotationally driven by a Q shaft motor 28, and rotates integrally with a ring-shaped clutch member 61 (refer to FIG. 3). The R shaft 22 includes a plurality (here, four) engagement members 31, each of which includes a hook on the bottom end. The orientation of the hooks is aligned to be the same as the direction in which the R shaft 22 rotates forward. The engagement members 31 are arranged at an equal interval on the same circular circumference (the center of the circle matches the center axis of the R shaft 22) on the bottom surface of the R shaft 22. Each of the engagement members 31 is capable of being moved up and down by an air cylinder which is not depicted in the drawings. The head holding body 21 further includes first and second lever pinching sections 51 and 71 illustrated in FIG. 5, and these will be described later.

The first head 120 is a member with a substantially columnar external shape, and includes a plurality (here, twelve) of the suction nozzles 13 on the bottom. The suction nozzle 13 is integral with a nozzle holder 12 which extends in the up-down directions. The nozzle holder 12 includes a nozzle operation lever 39 in the vicinity of the top end, and is positioned in a predetermined fixed position (a top position) by being biased upward by a spring 40. The nozzle operation levers 39 are present from the first nozzle operation lever 39 (A) to the last (the twelfth) nozzle operation lever 39 (L) according to the order in which the suction nozzles 13 are operated. When viewing from above as in FIG. 2, the order is counted counter-clockwise from the first to the last. A two-dimensional bar-code 42 is added to the first nozzle operation lever 39 (A). The two-dimensional bar-code 42 includes an identification code representing the head type, here, an identification code representing that the head is the first head 120. When the nozzle operation lever 39 is pressed down, the nozzle holder 12 and the suction nozzle 13 are lowered against the elastic force of the spring 40, and when the nozzle operation lever 39 is released from the downward pressing, the nozzle holder 12 and the suction nozzle 13 return to the fixed position due to the elastic force of the spring 40. The nozzle holder 12 meshes with a small gear 34 which is arranged to be on the same shaft as the nozzle holder 12. The small gears 34 are arranged at an equal interval on the same circular circumference (the center of the circle matches the center axis of the R shaft 22). A cylindrical gear 33 is arranged closer to the inside than the circular circumference along which the small gears 34 are lined up, includes gears on the side surface, and meshes with each of the small gears 34. The cylindrical gear 33 is designed with dimensions such that it is possible to insert the R shaft 22. A clutch member 62 which fits the clutch member (refer to FIG. 3) of the head holding body 21 is provided on the top end of the cylindrical gear 33.

For each of the suction nozzles 13, the first head 120 includes a pressure operation lever 35 which switches between supplying a negative pressure to the nozzle tip and supplying atmospheric pressure to the nozzle tip. The pressure operation lever 35 is a switch without a return function, and when the pressure operation lever 35 is positioned at the top, a negative pressure is supplied to the nozzle tip, and when the pressure operation lever 35 is positioned at the bottom, atmospheric pressure is supplied to the nozzle tip. The pressure operation levers 35 are also present from the first pressure operation lever 35 (A) to the last pressure operation lever 35 (L) according to the order in which the suction nozzles 13 are operated.

Furthermore, the first head 120 includes a disc-shaped base 36 (refer to FIG. 4) on the inside of the cylindrical gear 33. Although the base 36 is integral to the support member which supports the nozzle holder 12 and the small gears 34, the base 36 is not integral to the cylindrical gear 33. Therefore, the cylindrical gear 33 is capable of rotating independently from the base 36. Arc-shaped engagement holes 37 are formed in the base 36 to be capable of engaging with the hooks of the engagement members 31 of the R shaft 22.

The first head 120 is held in the head holding body 21 by the following procedure. First, the head holding body 21 is lowered, and, while inserting the R shaft 22 into the cylindrical gear 33, the engagement members 31 are lowered from the R shaft 22 by air cylinders which are not depicted in the drawings and are inserted into the engagement holes 37 of the base 36. Subsequently, the hooks of the engagement members 31 are engaged with the circumferential edge of the engagement holes 37 by causing the R shaft 22 to rotate forward using the R shaft motor 25. The engagement member 31 is lifted by the air cylinders which are not depicted in the drawings, and the clutch member 62 of the cylindrical gear 33 fits into the clutch member 61 of the head holding body 21. As a result, the first head 120 is held in the head holding body 21. When the Q shaft gear 27 of the head holding body 21 is rotated in this state, since, together with the rotation, the clutch member 61, the clutch member 62, the small gears 34, and the nozzle holders 12 rotate, the suction nozzles 13 rotate on the axes thereof. Accordingly, it is possible to correct the orientation (the angle) of the components which are sucked by the suction nozzles 13.

Figure 5:
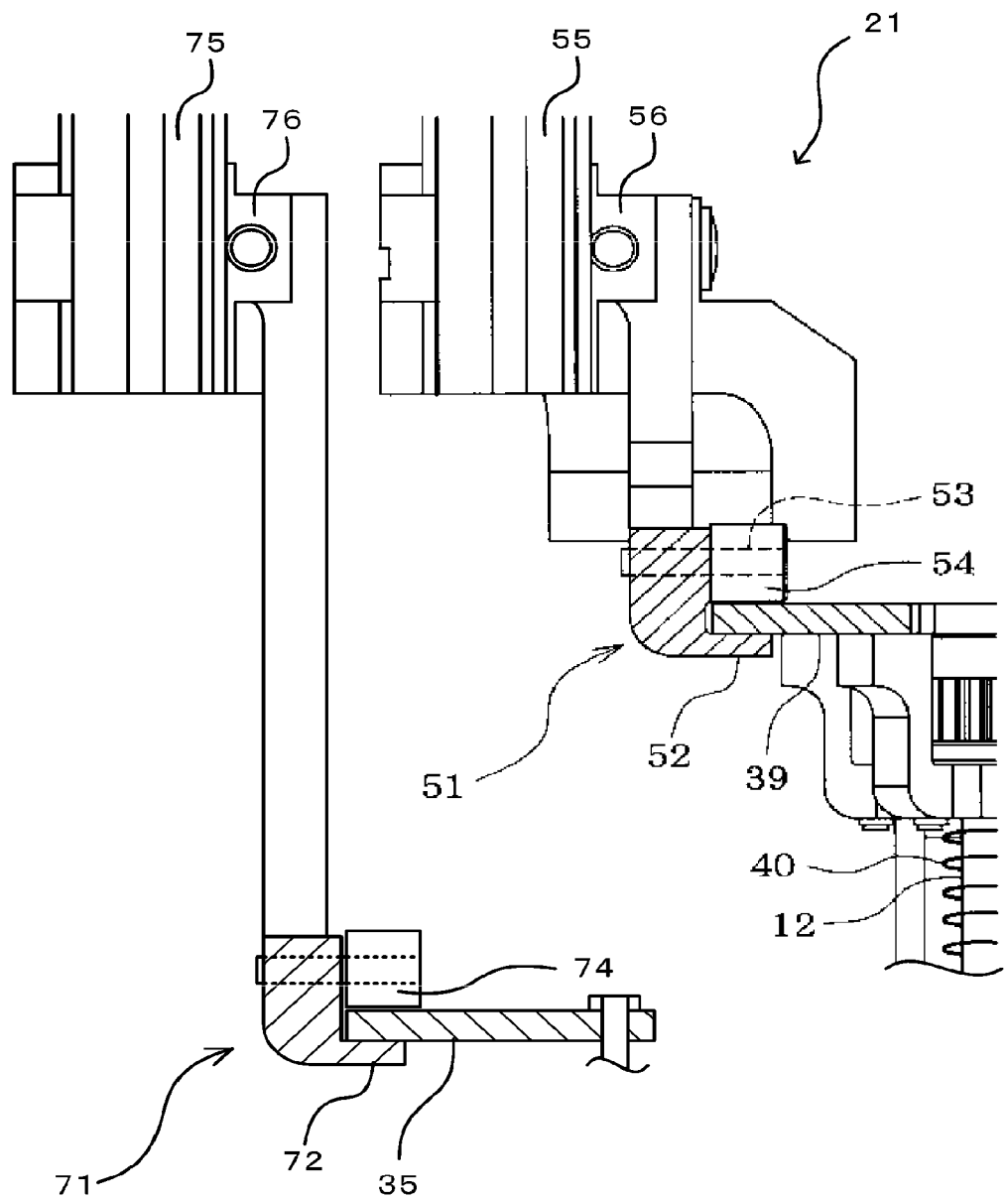
FIG. 5 is a sectional diagram of portions in the periphery of first and second lever pinching sections 51 and 71.

Here, description will return again to the head holding body 21. FIG. 5 is a sectional diagram of portions in the periphery of the first and second lever pinching sections 51 and 71. As illustrated in FIG. 5, the lever pinching section 51 which is included in the head holding body 21 is attached to a first Z-axis slider 56 which is capable of moving in the up-down directions along a first Z-axis guide rail 55 which is provided on the head holding body 21. Note that, the first Z-axis slider 56 is driven by a servomotor which is not depicted in the drawings. The first lever pinching section 51 pinches the nozzle operation lever 39 from above and below using a horizontal portion 52 which is an L-shaped member and a roller 54 which is attached to the top side of the horizontal portion 52. The roller 54 is supported by a horizontal shaft 53 to be capable of rotating. The gap between the first and last nozzle operation levers 39 (A) and 39 (L) is of a size at which it is possible for the first lever pinching section 51 to pass through in the up-down directions; however, the gaps between the other adjacent nozzle operation levers 39 are of a size at which it is not possible for the first lever pinching section 51 to pass through in the up-down directions (refer to FIG. 4). Therefore, from the state of FIG. 2, when the first head 120 is lifted relative to the R shaft 22 and the first head 120 is held in the head holding body 21, it is necessary to arrange the first lever pinching section 51 of the head holding body 21 directly above the gap between the first and last nozzle operation levers 39 (A) and 39 (L) such that the first lever pinching section 51 does not bump into the nozzle operation levers 39.

The head holding body 21 includes the second lever pinching section 71. The second lever pinching section 71 is positioned further outside in the diameter direction than the first lever pinching section 51 due to the relationship in which the pressure operation lever 35 is positioned further outside in the diameter direction than the nozzle operation lever 39. In the same manner as the first lever pinching section 51, the second lever pinching section 71 is attached to a second Z-axis slider 76 which is capable of moving in the up-down directions along a second Z-axis guide rail 75 which is provided on the head holding body 21. Note that, the second Z-axis slider 76 is driven by a servo motor which is not depicted in the drawings. The second lever pinching section 71 pinches the pressure operation lever 35 from above and below using a horizontal portion 72 which is an L-shaped member and a roller 74 which is attached to the top side of the horizontal portion 72. The gap between the adjacent pressure operation levers 35 is of a size at which it is possible for the second lever pinching section 71 to pass through in the up-down directions. From the state of FIG. 2, when the first head 120 is lifted relative to the R shaft and the first head 120 is held in the head holding body 21, if the first lever pinching section 51 of the head holding body 21 is arranged directly above the gap between the first and last nozzle operation levers 39 (A) and 39 (L) as described above, the second lever pinching section 71 is also arranged directly above the gap between the first and last pressure operation levers 35 (A) and (L).

Figure 6:
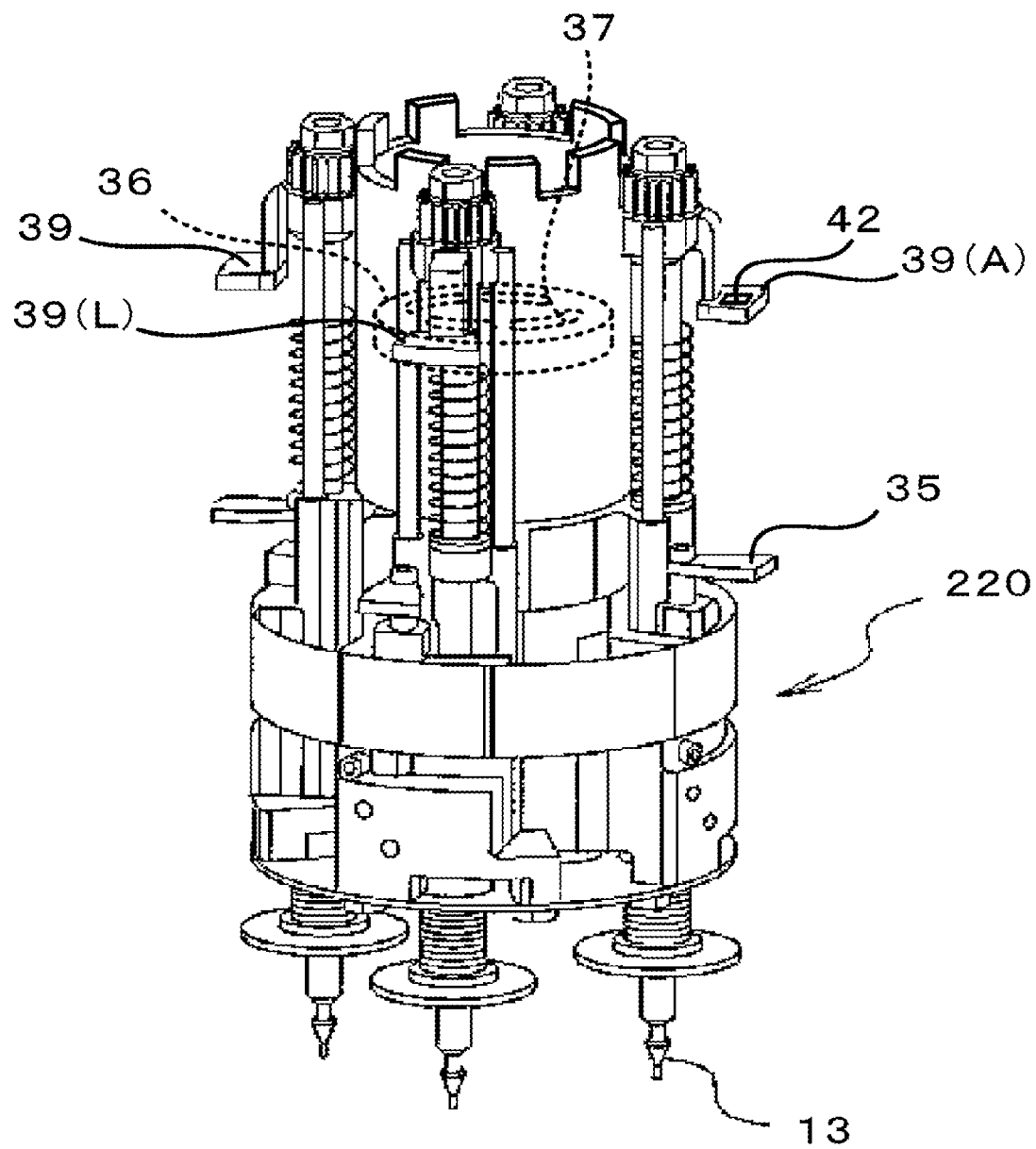
FIG. 6 is a perspective diagram of a second head 220.
Figure 7:
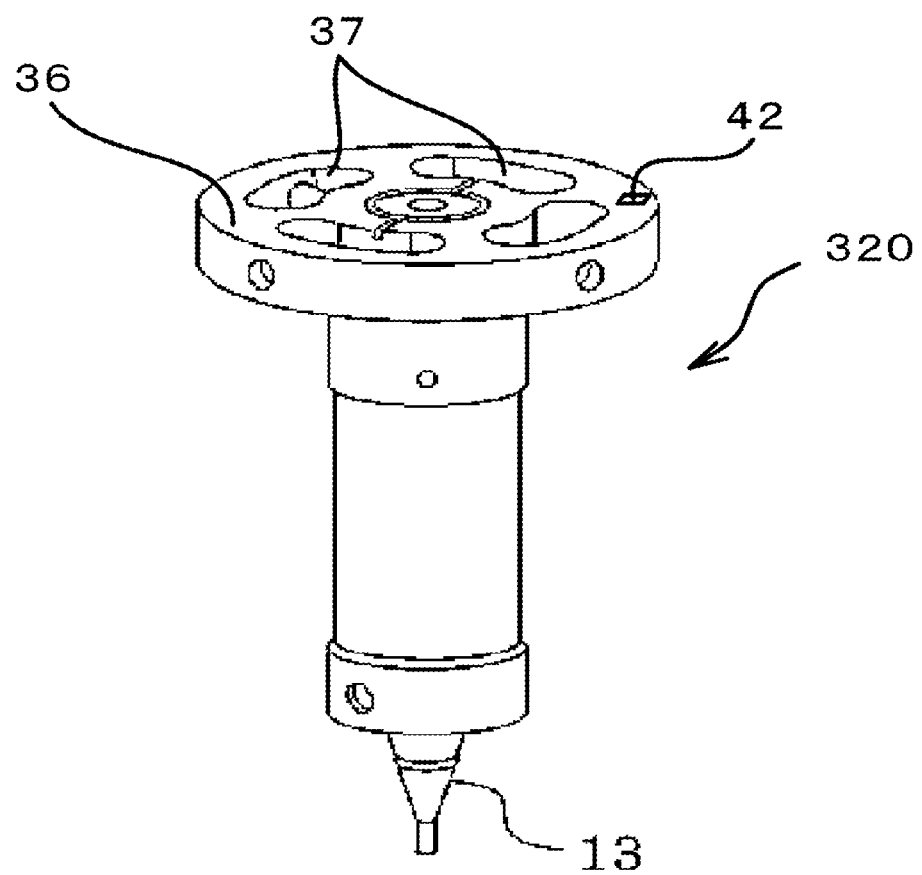
FIG. 7 is a perspective diagram of a third head 320.

Next, description will be given of the second head 220 and third head 320 of different types from the first head 120. FIG. 6 is a perspective diagram of the second head 220, and FIG. 7 is a perspective diagram of the third head 320. The second head 220 illustrated in FIG. 6 is stored in the head storage area 140 (refer to FIG. 1). The second head 220 has the same configuration as the first head 120 except for in that there are four of the suction nozzles 13 provided, in that the heights of the nozzle operation levers 39, the pressure operation levers 35, and the base 36 differ from the first head 120 when stored in the head storage area 140, and in that the interval between the adjacent nozzle operation levers 39 is wider. For example, the two-dimensional bar-code 42 is added to the first nozzle operation lever 39 (A). FIG. 7 is a perspective diagram of the third head 320. The third head 320 is stored in the head storage area 140 (refer to FIG. 1). The third head 320 is provided with only one of the suction nozzles 13, and does not include the nozzle operation lever 39 and the pressure operation lever 35. Therefore, the two-dimensional bar-code 42 is added to the top face of the base 36. In the third head 320, the height position of the base 36 when the third head 320 is stored in the storage location 142 differs from that of the first head 120 and the second head 220.

[Operations of Component Mounting System 1—Component Mounting Operations]

Next, description will be given of the operations in which the CPU 162 of the controller 160 of the component mounting device 100 uses the head unit 110 to mount components on the printed circuit board 101 based on production job data which is received from the management computer 200. It will be assumed that the first head 120 is attached to the head unit 110. In advance, the first lever pinching section 51 is positioned in the gap between the first and last nozzle operation levers 39 (A) and 39 (L), the height of the first lever pinching section 51 matches the nozzle operation levers 39, the second lever pinching section 71 is positioned in the gap between the first and last pressure operation levers 35 (A) and 35 (L), and the height of the second lever pinching section 71 matches the pressure operation levers 35.

The CPU 162 causes the plurality of suction nozzles 13 of the head unit 110 to sequentially suck the components which are supplied from the feeder 152. Specifically, the CPU 162 uses the R shaft motor 25 to rotate the first head 120, the first nozzle operation lever 39 (A) is pinched by the first lever pinching section 51, and the pressure operation lever 35 of the first suction nozzle 13 is pinched by the second lever pinching section 71. Note that, when rotating the first head 120, generally, the cylindrical gear 33 is rotated in the same phase as the first head 120. Accordingly, the suction nozzles 13 do not rotate on the axes thereof when the first head 120 rotates. However, when correcting the orientation (the angle) of the components which are sucked by the suction nozzles 13, the cylindrical gear 33 is rotated independently of the first head 120.

Next, the CPU 162 controls the X-axis slider 112 and the Y-axis slider 116 to arrange the first suction nozzle 13 directly above a desired component. Subsequently, the CPU 162 controls the first Z-axis slider 56 to lower the first suction nozzle 13 using the first lever pinching section 51, and controls the second Z-axis slider 76 to switch the pressure operation lever 35 such that a negative pressure is supplied to the first suction nozzle 13 using the second lever pinching section 71. Accordingly, the desired component is sucked by the first suction nozzle 13.

Next, the CPU 162 rotates the first head 120 by a predetermined angle only using the R shaft motor 25. While the first head 120 is rotating, the CPU 162 controls the first Z-axis slider 56 to lift the first lever pinching section 51 such that the first suction nozzle 13 returns to the fixed position, and further, ensures that the second nozzle operation lever 39 is pinched by the first lever pinching section 51. In addition, the CPU 162 waits for the first pressure operation lever 35 to pass the second lever pinching section 71, controls the second Z-axis slider 76 to return the second lever pinching section 71 to the original position, and ensures that the second pressure operation lever 35 is pinched by the second lever pinching section 71. Therefore, the first suction nozzle 13 is still being supplied a negative pressure, and continues to suck the component.

Next, the CPU 162 controls the X-axis slider 112 and the Y-axis slider 116 to arrange the second suction nozzle 13 directly above a desired component. Subsequently, the CPU 162 controls the first Z-axis slider 56 to lower the second suction nozzle 13 using the first lever pinching section 51, and controls the second Z-axis slider 76 to switch the pressure operation lever 35 such that a negative pressure is supplied to the second suction nozzle 13 using the second lever pinching section 71. Accordingly, the desired component is sucked by the second suction nozzle 13.

Similar operations are repeated for the third suction nozzle 13 onward also. Accordingly, it is possible to cause components to be sucked by all of the first to last suction nozzles 13.

Subsequently, the CPU 162 controls the X-axis slider 112 and the Y-axis slider 116 to move the head unit 110 toward above the printed circuit board 101. During the movement, the head holding body 21 is withdrawn upward such that the components sucked by the suction nozzles 13 do not interfere with structures on the component mounting device 100 or the components which are already mounted onto the printed circuit board 101. During the movement, the first head 120 is rotated to arrange the first nozzle operation lever 39 (A) between the first lever pinching sections 51. At a desired position of the printed circuit board 101, the CPU 162 controls the first Z-axis slider 56 to lower the first suction nozzle 13 using the first lever pinching section 51, and subsequently controls the second Z-axis slider to switch the pressure operation lever 35 such that atmospheric pressure is supplied to the first suction nozzle 13 using the second lever pinching section 71. Accordingly, the component sucked by the first suction nozzle 13 is mounted onto the desired position of the printed circuit board 101. The components sucked by the second suction nozzle 13 onward are also mounted onto the printed circuit board 101 in the same manner.

[Operations of Component Mounting System 1—Head Automatic Exchanging]

Figure 8:
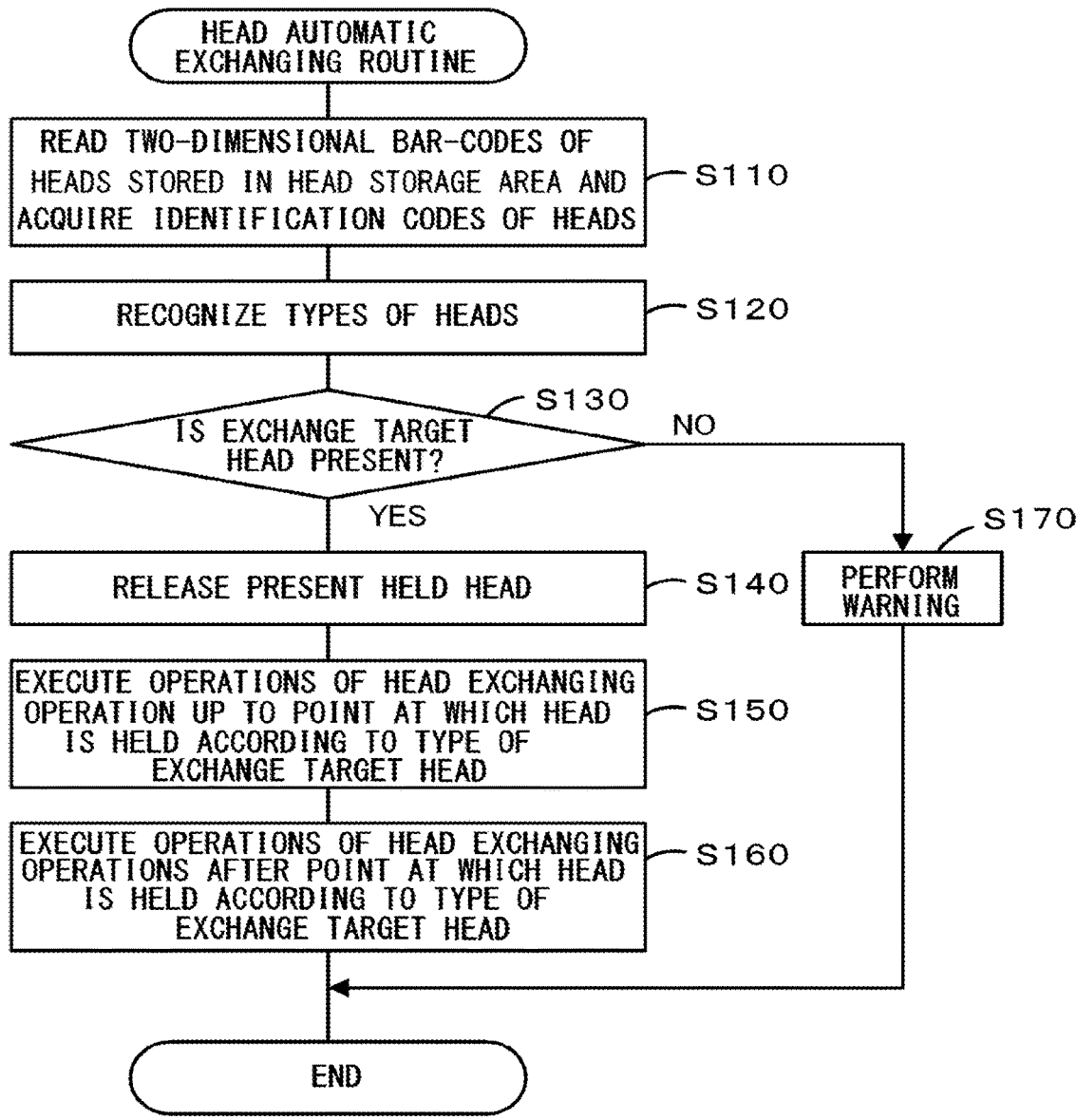
FIG. 8 is a flowchart of a head automatic exchanging routine.

Next, description will be given of the operations in which the CPU 162 of the controller 160 of the component mounting device 100 automatically exchanges the head based on production job data which is received from the management computer 200. FIG. 8 is a flowchart of the head automatic exchanging routine. The program of the head automatic exchanging routine is stored in the ROM 164 of the controller 160. The CPU 162 of the controller 160 determines whether it is time to automatically exchange the head based on the production job data which is received from the management computer 200, and, if it is time to automatically exchange the head, starts the head automatic exchanging routine.

When the head automatic exchanging routine is started, the CPU 162 first reads the two-dimensional bar-codes of the heads which are stored in the storage locations 142 of the head storage area 140 and acquires the identification codes of the heads (step S110). Specifically, the CPU 162 controls the X-axis slider 112 and the Y-axis slider 116 to move the head unit 110 to the head storage area 140. The two-dimensional bar-code 42 added to the head which is stored in each of the storage locations 142 is read by the mark camera 130 which is provided with a bar-code reader function, and the identification code stored in the two-dimensional bar-code 42 is acquired.

Next, the CPU 162 recognizes the types of the heads based on the identification codes of the heads which are acquired (step S120). The correspondence relationship between the identification codes and the head types is converted to a table and stored in the HDD 168. For example, as illustrated in Table 1, in the table, the first head 120 which holds twelve suction nozzles is associated with the identification code "001", and the second head 220 which hold four suction nozzles are associated with the identification code "002". The CPU 162 recognizes the types of the heads by looking up the identification codes of the heads which are acquired in the table.

TABLE 1

| Identification Code | Head Type |
| --- | --- |
| 001 | First head holding twelve suction nozzles |
| 002 | Second head holding four suction nozzles |
| . | . |
| . | . |
| . | . |

Next, the CPU 162 determines whether the exchange target head is present among the heads which are stored in the head storage area 140 (step S130). Which head type the exchange target head is on this occasion is described in the production job data which is received from the management computer 200.

If the exchange target head is not present in step S130, since it is not possible to execute the head automatic exchanging, the CPU 162 outputs a warning (step S170) and ends the routine. Specifically, the CPU 162 outputs a warning message (for example, the sentence "exchange target head not present") on a display, which is not depicted in the drawings, of the component mounting device 100, outputting a warning sound from a speaker which is not depicted in the drawings, or the like.

Meanwhile, if the exchange target head is present in step S130, the CPU 162 releases the head which is presently being held (step S140). For example, in a case in which the first head 120 is being held in the head holding body 21 of the head unit 110, the first head 120 is released by the following procedure. In other words, the CPU 162 controls the X-axis slider 112 and the Y-axis slider 116 to move the head unit 110 to directly above the vacant storage location 142 of the head storage area 140. Next, the CPU 162 rotates the first head 120 to ensure that the first lever pinching section 51 is positioned in the gap between the first and last nozzle operation levers 39 (A) and 39 (L). Next, the CPU 162 lowers the head holding body 21 and stores the first head 120 in the storage location 142. Subsequently, the CPU 162 removes the hooks of the engagement members 31 from the engagement holes 37 of the first head 120 by rotating the R shaft 22 after lowering the hooks of the engagement members 31 lower than the engagement hole 37. Furthermore, the CPU 162 completes the releasing of the first head 120 by lifting the engagement member 31.

Next, the CPU 162 executes the operations of the head exchanging operations up to the point at which the head is held according to the type of the exchange target head (step S150). For example, in a case in which the head holding body 21 of the head unit 110 is caused to hold the second head 220, the operations up to the point at which the second head 220 is held are performed by the following procedure. Note that, the orientation of the second head 220 which is stored in the storage location 142 is predetermined such that the first lever pinching section 51 is positioned between the first and last nozzle operation levers 39 (A) and 39 (L). First, the CPU 162 controls the X-axis slider 112 and the Y-axis slider 116 to move the head unit 110 to directly above the storage location 142 in which the second head 220 is stored. Next, the CPU 162 inserts the hooks of the engagement members 31 into the engagement holes 37 which are provided in the base 36 of the second head 220 by lowering the engagement members 31 while lowering the head holding body 21 to insert the R shaft 22 into the cylindrical gear 33. Subsequently, the CPU 162 causes the hooks of the engagement members 31 to engage with the circumferential edge of the engagement holes 37 by rotating the R shaft 22. At this time, the height of the base 36 is a value unique to the second head 220 and is associated with the second head 220 and stored in the HDD 168. Since the CPU 162 can ascertain the head type, it is possible to acquire the height of the base 36 corresponding to the head from the HDD 168 and set the lowered position of the head holding body 21 based on the acquired height. The lowered position of the head holding body 21 is set according to the stroke length of the engagement members 31 in the up-down directions and the height of the base 36. Next, the CPU 162 holds the second head 220 by lifting the engagement members 31 to cause the clutch member 62 of the second head 220 to fit the clutch member 61 of the head holding body 21.

Next, the CPU 162 executes the operations of the head exchanging operations after the head is held according to the type of the exchange target head (step S160) and ends the present routine. For example, in a case in which the second head 220 is being held in the head holding body 21 of the head unit 110, the operations after the point at which the second head 220 is held are performed by the following procedure. First, the CPU 162 controls the first and second Z-axis sliders 56 and 76 to lower the first lever pinching section 51 to the height of the nozzle operation lever 39 of the second head 220, and to lower the second lever pinching section 71 to the height of the pressure operation lever 35 of the second head 220. Accordingly, the first lever pinching section 51 is positioned in the gap between the first and last nozzle operation levers 39 (A) and (L), and the second lever pinching section 71 is positioned in the gap between the first and last pressure operation levers 35 (A) and (L). The heights of the nozzle operation lever 39 and the pressure operation lever 35 are values unique to the second head 220 and are associated with the second head 220 and stored in the HDD 168. Since the CPU 162 can ascertain the head type, it is possible to acquire the heights of the nozzle operation lever 39 and the pressure operation lever 35 corresponding to the head from the HDD 168 and set the lowered positions of the first and second lever pinching sections 51 and 71 based on the acquired heights. The lifting/lowering mechanism of the head holding body 21 is controlled to lift the head holding body 21 to a withdrawn position at which the suction nozzle 13 of the second head 220 or the component which is sucked by the suction nozzle 13 does not interfere with structures or the like on the component mounting device 100. The withdrawn position is also a value unique to the second head 220 and is associated with the second head 220 and stored in the HDD 168. Since the CPU 162 can ascertain the head type, it is possible to appropriately set the withdrawn position corresponding to the head from the HDD 168. Subsequently, the CPU 162 rotates the second head 220 by causing the R shaft 22 to rotate forward, the first lever pinching section 51 interposes the first nozzle operation lever 39 (A) and the second lever pinching section interposes the first pressure operation lever 35. The operations of the head exchanging operations after the head is held are completed according to the above description.

After the head automatic exchanging routine ends, the CPU 162 executes the component mounting operations described above and mounts the components onto the printed circuit board 101.

Effects of Present Embodiment

According to the component mounting device 100 of the present embodiment described above, since the head type is recognized from the identification code which is added to the head before the head exchanging, it is possible to correctly recognize the head type which is stored in the head storage area 140. According to the component mounting device 100, since the head exchanging operations are performed according to the head type which is correctly recognized, it is possible to execute exchanging operations which are appropriate for the head type. Note that, the head exchanging operations are different operations from the ordinary component mounting operations, and refer to operations which are necessary for exchanging the head.

According to the component mounting device 100, it is possible to appropriately execute the operations of the head exchanging operations after the head holding body 21 holds the exchange target head according to the head type. For example, even in a case in which the height of the nozzle operation lever 39, and the height of the pressure operation lever 35 of the head which is stored in the head storage area 140 differ depending on the head type, it is possible to appropriately handle the differences.

Furthermore, according to the component mounting device 100, it is possible to appropriately execute the operations of the head exchanging operations up to a point at which the head holding body 21 holds the exchange target head according to the head type. For example, even in a case in which the height of the base 36 of the head which is stored in the head storage area 140 differs according to the head type, it is possible to cause the engagement members 31 to appropriately engage with the engagement holes 37 which are provided in the base 36.

Other Embodiments

Note that, the present disclosure is not limited to the embodiment described above, and, needless to say, may be implemented in various modes within the technical scope of the present disclosure.

For example, in the embodiment described above, the head holding body 21 of the component mounting device 100 may be provided with a Z-axis lifting/lowering slider similar to the first Z-axis slider 56, and a small form factor camera which is attached to the bottom end of the Z-axis lifting/lowering slider and is capable of imaging a minute component which is sucked by the suction nozzle 13 of the first head 120 from the horizontal directions. By analyzing the image which is captured by the small form factor camera, it is possible to recognize the orientation (the angle) of the minute component which is sucked by the suction nozzle 13 of the first head 120, and it is possible to restore the correct orientation. In a case in which the head which is held in the head holding body 21 is the third head 320 which includes only the single suction nozzle 13, since the component which is sucked by the suction nozzle 13 is a comparatively large form factor component, it is possible to check the orientation of the component using the parts camera 132. Therefore, the small form factor camera is not used. In this case, the small form factor camera is withdrawn upward. Since the withdrawn position is a height at which the small form factor camera does not interfere with the large form factor component which is sucked by the suction nozzle 13 of the third head 320, the withdrawn position is a value unique to the third head 320. Therefore, in step S160 of the head automatic exchanging routine, in a case in which the exchange target head is the third head 320, the CPU 162 may set the withdrawn position of the small form factor camera according to the third head 320, and control the Z-axis lifting/lowering slider to move the small form factor camera to the withdrawn position.

In the embodiment described above, the parameters of the servo motor of each operation shaft may be set to values unique to the head. For example, when the second head 220 is held after releasing the holding of the first head 120, and the second head 220 is pulled up from the storage location 142, the torque of the Z-axis servo motor which is provided in the lifting/lowering mechanism of the head holding body 21 may be set according to the weight of the second head 220. In this manner, it is possible to pull up the head with an appropriate torque according to the weight of each of the heads.

In the embodiment described above, before starting the head automatic exchanging routine, the reading of the two-dimensional bar-codes which are added to all of the heads which are stored in the head storage area 140 may be executed, and which head type is stored in which of the storage locations 142 may be stored in the RAM 166. In this manner, it is possible to skip the processes of steps S110 and S120 of the head automatic exchanging routine.

In the embodiment described above, in a case in which the CPU 162 has ascertained which of the storage locations 142 of the head storage area 140 the exchange target head is stored in from the production job data, in step S110 of the head automatic exchanging routine, only the two-dimensional bar-code of the head which is stored in the storage location may be read.

In the embodiment described above, the values unique to the head (the height of the base 36, the heights of the nozzle operation levers 39 and the pressure operation levers 35, the withdrawn position, and the like) are associated with the each head type and stored in the HDD 168; however, these values may be included in the head type and stored in the table (refer to Table 1) indicating the correspondence relationship between the identification codes and the heads. In this manner, the CPU 162 can directly acquire the values unique to the head from the identification codes.

In the embodiment described above, the component supply device 150 supplies the reel components; however, the component supply device 150 may supply tray components or bulk components.

In the embodiment described above, the suction nozzles of the head which is held in the head holding body 21 may be automatically exchangeable with the suction nozzles which are stored in the nozzle stocker 134.

INDUSTRIAL APPLICABILITY

The present disclosure may be used in a control device or the like which uses a printed circuit board on which components are mounted.

REFERENCE SIGNS LIST

1: component mounting system, 12: nozzle holder, 13: suction nozzle, 21: head holding body, 22: R shaft, 24: R shaft gear, 25: R shaft motor, 27: Q shaft gear, 28: Q shaft motor, 31: engagement member, 33: cylindrical gear, 34: small gear, 35: pressure operation lever, 36: base, 37: engagement hole, 39: nozzle operation lever, 40: spring, 42: two-dimensional bar-code, 51: first lever pinching section, 52: horizontal portion, 53: horizontal shaft, 54: roller, 55: first Z-axis guide rail, 56: first Z-axis slider, 61: clutch member, 62: clutch member, 71: second lever pinching section, 72: horizontal portion, 74: roller, 75: second Z-axis guide rail, 76: second Z-axis slider, 100: component mounting device, 101: printed circuit board, 102: base, 104: board conveyance device, 106: supporting board, 108: conveyor belt, 110: head unit, 112: X-axis slider, 114: guide rail, 116: Y-axis slider, 118: guide rail, 120: first head, 130: mark camera, 132: parts camera, 134: nozzle stocker, 140: head storage area, 142: storage location, 150: reel unit, 152: feeder, 154: reel, 160: controller, 162: CPU, 164: ROM, 166: RAM, 168: HDD, 200: management computer, 220: second head, 320: third head.

The invention claimed is:

1. A component mounting device, comprising:
a head that includes an engaged member and a plurality of nozzles, each of the nozzles configured to hold a component and mount the component at a predetermined position on a printed circuit board;
storage means mounted on a base of the component mounting device for storing a plurality of exchangeable heads each including an identification code;
memory means for storing a correspondence relationship between the identification code and a head type;
head holding means for detachably holding the head, the head holding means including an engagement member which engages with the engaged member to hold the head;
head movement means mounted on the base for moving the head holding means;
reading means for reading the identification code of each of the plurality of exchangeable heads stored in the storage means; and
control means for recognizing the head type of each of the plurality of exchangeable heads stored in the storage means based on the correspondence relationship and the identification code read by the reading means, determining whether an exchange target head is present among the plurality of exchangeable heads, the exchange target head being required for a next operation of the component mounting device, controlling one or both of the head holding means and the head movement means to perform head exchanging operations to exchange the head held in the head holding means for the exchange target head which is determined to be stored in the storage means,
wherein a relative height of the engaged member varies based on the head type, and
wherein the control means determines the relative height of the engaged member based on the identification code and during the head exchanging operations a lowered position of the head holding means is set based on the relative height of the engaged member.

2. The component mounting device according to claim 1, wherein the control means controls at least one of the head holding means and the head movement means to perform, from the head exchanging operations, at least operations after the head holding means holds the exchange target head, according to the recognized head type.

3. The component mounting device according to claim 1, wherein the head holding means includes at least one of a nozzle lifting/lowering mechanism that lifts/lowers the nozzle which is provided in the head, a head lifting/lowering mechanism which lifts/lowers the head, an opening/closing mechanism that opens/closes a valve which adjusts a pressure of the nozzle, and a camera lifting/lowering mechanism that lifts/lowers the camera which images the component which is held on a tip of the nozzle from a horizontal direction, and
wherein the control means controls at least one of mechanisms included in the head holding means to perform, from the head exchanging operations, at least operations after the head holding means holds the exchange target head, according to the recognized head type.

4. The component mounting device according to claim 1, wherein the control means controls at least one of the head holding means and the head movement means to perform, from the head exchanging operations, at least operations up to a point at which the head holding means holds the exchange target head, according to the recognized head type.

5. A component mounting device, comprising:

a head that includes an engaged member and a plurality of nozzles, each of the nozzles configured to hold a component and mount the component at a predetermined position on a printed circuit board;

a head storage area mounted on a base of the component mounting device that stores a plurality of exchangeable heads each including an identification code;

a memory that stores a correspondence relationship between the identification code and a head type;

a head unit that detachably holds the head, the head unit including an engagement member which engages with the engaged member to hold the head;

at least one slider mounted on the base that moves the head unit;

a camera on the head unit that reads the identification code of each of the plurality of exchangeable heads stored in the head storage area; and a controller configured to recognize the head type of each of the plurality of exchangeable heads stored in the head storage area based on the correspondence relationship and the identification code read by the camera, determine whether an exchange target head is present among the plurality of exchangeable heads, the exchange target head being required for a next operation of the component mounting device, and control one or both of the head unit and the at least one slider to perform head exchanging operations to exchange the exchange target head determined to be held in the head storage area for the head on the head unit, wherein a relative height of the engaged member varies based on the head type, and wherein the controller determines the relative height of the engaged member based on the identification code and during the head exchanging operations a lowered position of the head unit is set based on the relative height of the engaged member.

* * * * *